United States Patent
Gomm et al.

(10) Patent No.: US 7,945,800 B2
(45) Date of Patent: *May 17, 2011

(54) SYNCHRONIZATION DEVICES HAVING INPUT/OUTPUT DELAY MODEL TUNING ELEMENTS IN SIGNAL PATHS TO PROVIDE TUNING CAPABILITIES TO OFFSET SIGNAL MISMATCH

(75) Inventors: Tyler J. Gomm, Meridian, ID (US); Gary M. Johnson, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 930 days.

This patent is subject to a terminal disclaimer.

(21) Appl. No.: 11/496,361

(22) Filed: Jul. 30, 2006

(65) Prior Publication Data
US 2006/0265622 A1    Nov. 23, 2006

Related U.S. Application Data

(63) Continuation of application No. 10/744,918, filed on Dec. 23, 2003, now Pat. No. 7,111,185.

(51) Int. Cl.
*G06F 1/12* (2006.01)
(52) U.S. Cl. .......... 713/401; 713/400
(58) Field of Classification Search ........... 713/400.401, 713/400, 401; 327/158
See application file for complete search history.

(56) References Cited

U.S. PATENT DOCUMENTS

| | | | |
|---|---|---|---|
| 6,066,969 A * | 5/2000 | Kawasaki et al. | 327/156 |
| 6,278,309 B1 * | 8/2001 | Saeki | 327/261 |
| 6,281,725 B1 * | 8/2001 | Hanzawa et al. | 327/152 |
| 6,339,553 B1 * | 1/2002 | Kuge | 365/194 |
| 6,476,652 B1 * | 11/2002 | Lee et al. | 327/158 |
| 6,492,852 B2 * | 12/2002 | Fiscus | 327/158 |
| 6,552,587 B2 * | 4/2003 | Kim et al. | 327/158 |
| 6,570,419 B2 * | 5/2003 | Hanzawa et al. | 327/152 |
| 6,570,420 B1 * | 5/2003 | Trivedi et al. | 327/156 |
| 6,570,813 B2 * | 5/2003 | Van De Graaff | 365/233 |
| 6,693,472 B2 * | 2/2004 | Mikhalev et al. | 327/149 |
| 6,765,836 B2 * | 7/2004 | Menczigar | 365/212 |
| 6,791,888 B2 * | 9/2004 | Kang | 365/193 |
| 6,845,458 B2 * | 1/2005 | Lin | 713/401 |
| 6,845,459 B2 * | 1/2005 | Lin | 713/401 |
| 6,906,566 B2 * | 6/2005 | Drexler | 327/158 |
| 6,937,076 B2 * | 8/2005 | Gomm | 327/158 |
| 6,944,833 B2 * | 9/2005 | Jeon | 716/1 |
| 6,987,409 B2 * | 1/2006 | Kim et al. | 327/158 |
| 7,028,207 B2 * | 4/2006 | Gomm | 713/401 |

(Continued)

FOREIGN PATENT DOCUMENTS

TW    508593    11/2002

(Continued)

*Primary Examiner* — Chun Cao
(74) *Attorney, Agent, or Firm* — Lerner, David, Littenberg, Krumholz & Mentlik, LLP

(57) ABSTRACT

Apparatus for synchronizing signals. For memory devices, such as SDRAMs, implementing a synchronization device to synchronize one signal, such as an external clock signal with a second signal, such as a data signal, tuning elements may be provided at various points in the signal path of the synchronization device. The tuning elements are designed to be identical, such that a single design may be used to a signal mismatch that is produced in either direction, using a single design. The tuning elements may be implemented to provide uniformity in the access time through a range of conditions, such as drain voltages and temperatures.

8 Claims, 14 Drawing Sheets

U.S. PATENT DOCUMENTS

| | | | |
|---|---|---|---|
| 7,111,185 B2 * | 9/2006 | Gomm et al. | 713/401 |
| 2002/0097074 A1 | 7/2002 | Kim et al. | |
| 2003/0067332 A1 | 4/2003 | Mikhalev et al. | |
| 2003/0128622 A1 | 7/2003 | Graaff | |

FOREIGN PATENT DOCUMENTS

| | | |
|---|---|---|
| TW | 200307291 | 12/2003 |

* cited by examiner

SYNCHRONIZATION DEVICES HAVING INPUT/OUTPUT DELAY MODEL TUNING ELEMENTS IN SIGNAL PATHS TO PROVIDE TUNING CAPABILITIES TO OFFSET SIGNAL MISMATCH

CROSS-REFERENCE TO RELATED APPLICATION

This application is a continuation of U.S. patent application Ser. No. 10/744,918, which was filed on Dec. 23, 2003, now U.S. Pat No. 7,111,185 which issued on Sep. 19, 2006.

BACKGROUND OF THE INVENTION

1. Field of the Invention

The present invention relates generally to memory devices and, more particularly, to devices implemented to synchronize signals in memory devices.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In high speed memory devices such as Double Data Rate Synchronous Dynamic Random Access Memory (DDR SDRAM) devices, it is often desirable to synchronize the timing of certain signals, such as clock signals and data signals which may be external to the memory devices, with internally generated clock signals or data signals, or with other external signals. Various synchronization devices may be implemented to provide an output signal that is matched in terms of frequency and/or phase to the input signal, which may be an external clock signal, for example. Synchronization devices may, for example, be implemented to synchronize an external system clock with data being transmitted from the memory device. Ideally, the time between the transition of the clock signal and the edge of the data signal (i.e., the "access time") is zero. Accordingly, it is advantageous to minimize the access time ($t_{AC}$) in memory devices.

Synchronization devices, such as delay locked loop (DLL) circuits, measure controlled delay (MCD) circuits and synchronous mirror delay (SMD) circuits, for example, implement I/O modeling techniques to mimic actual input/output (I/O) delay paths in the memory device such that the input signal can be shifted to account for the delays. Accordingly, synchronization devices are generally designed under an assumption that the I/O model properly mimics the actual I/O delay paths. Disadvantageously, if the I/O model does not properly mimic the actual I/O delay path, a synchronization device may not maintain proper access time ($t_{AC}$) across all device voltages and temperatures that may be experienced during device operation. Accordingly, it may be advantageous to provide synchronization devices that can be tuned to provide a delay that behaves with a desired delay response across $V_{DD}$ and temperature.

Embodiments of the present invention may address one or more of the problems set forth above.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
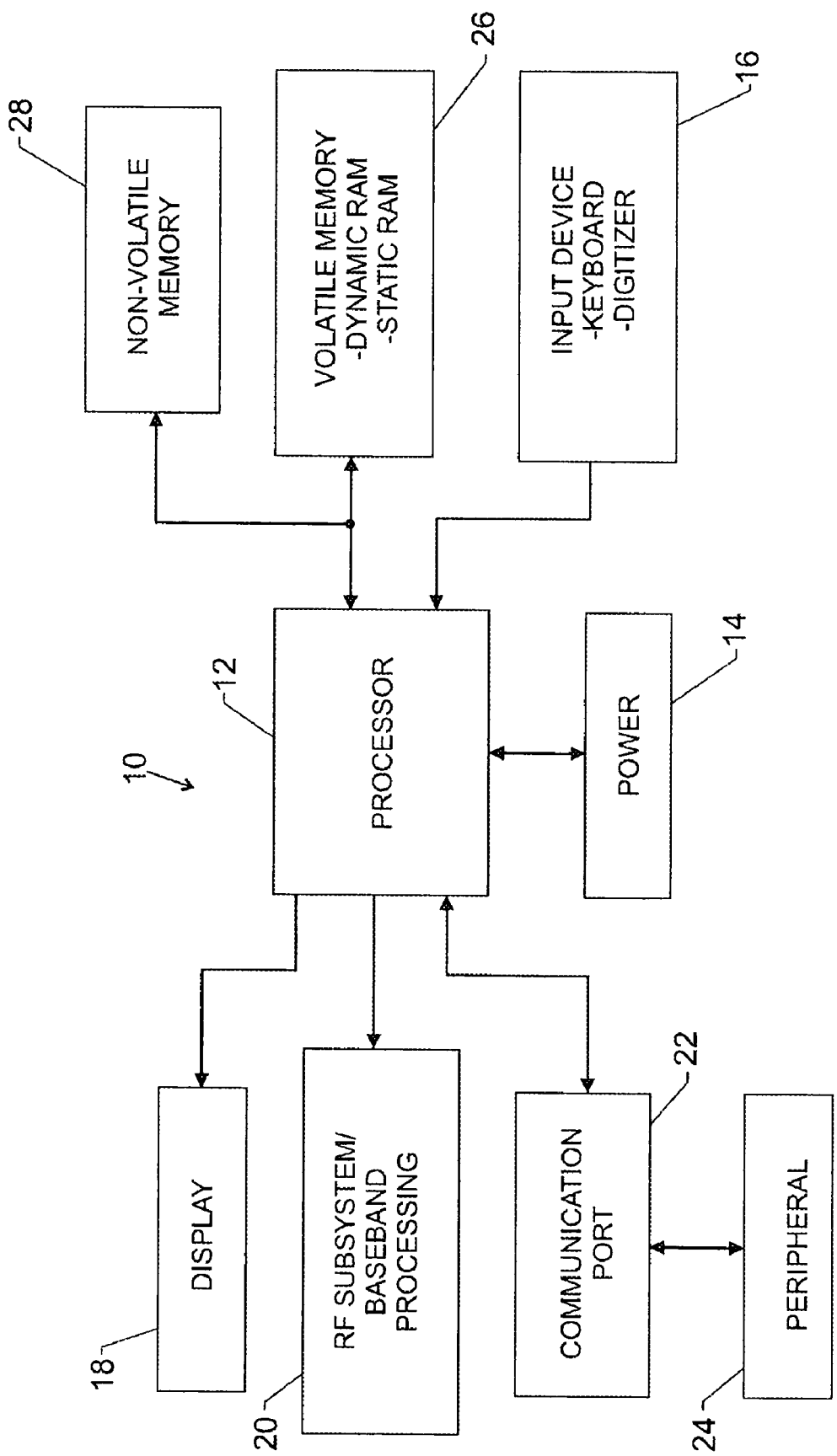
FIG. 1 illustrates a block diagram of an exemplary processor-based device which may incorporate the present technique.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pen, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the software program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory 26, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

The volatile memory 26 may include a number of SDRAMs which implement DDR technology. DDR SDRAMs effectively double the allowable throughput of the memory device by supporting data transfers on each of the rising and falling edges of a clock signal. As can be appreciated, the SDRAM differs from a DRAM in that the SDRAM is controlled synchronously with a timing source, such as the system clock. To accomplish synchronous control, latches are used to provide data and other information on the inputs and outputs of the SDRAM. Thus, in a read operation for example, the processor 12 may access a data output latch a predetermined number of clock cycles after issuing the read request. The predetermined number of clock cycles typically corresponds to the amount of time needed to access the requested data, move the data to the output latch, and allow the data to stabilize. The data is clocked out of the output latch synchronous with the system clock which provides the timing source for the processor 12.

Synchronization of the data read from the output latch with the system clock is generally implemented via a delay locked loop (DLL) circuit, a measure controlled delay (MCD) circuit, a synchronous mirror delay (SMD) circuit, or the like. In general, the synchronization device locks the data output signal to the system clock by shifting the output data in time such that it is nominally aligned with the system clock. Thus, the synchronization device can compensate for timing delays introduced by various components in the SDRAM, as described further below.

Write operations also are performed synchronously or in synchronization with a timing source, such as the system clock or other externally provided timing source. Thus, data may be clocked into an input latch and written to the memory array under control of a write clock provided from the external device which is performing the write operation. Synchronization devices may also be implemented to synchronize write data with the write clock.

Figure 2:
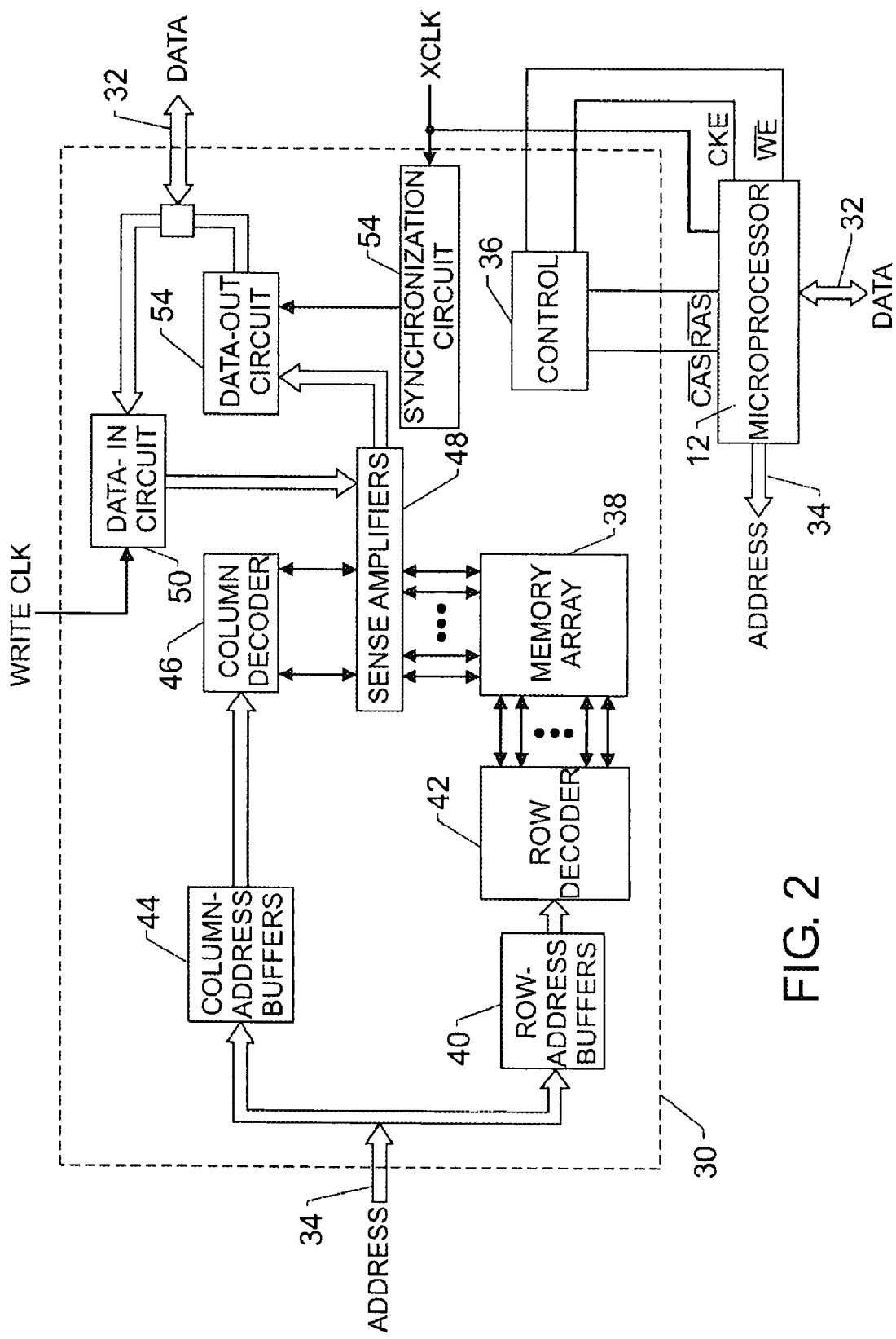
FIG. 2 illustrates a block diagram of an exemplary memory device which may be used in the processor-based device of FIG. 1.

Turning now to FIG. 2, a block diagram depicting an exemplary embodiment of a DDR SDRAM which may implement embodiments of the present invention is illustrated. The description of the DDR SDRAM 30 has been simplified for illustrative purposes and is not intended to be a complete description of all features of a DDR SDRAM. The present technique may not be limited to DDR SDRAMs, and may be equally applicable to other synchronous memory devices, and other devices for use in communication applications, such as double-edge triggered applications, which may benefit from strict adherence to timing. Those skilled in the art will recognize that various devices may be used in the implementation of the present invention.

Control, address, and data information provided over a memory bus are represented by individual inputs to the DDR SDRAM 30. These individual representations are illustrated by a databus 32, address lines 34, and various discrete lines directed to control logic 36. As is known in the art, the SDRAM 30 includes a memory array 38 which comprises rows and columns of addressable memory cells. Each memory cell in a row is coupled to a word line, and each memory cell in a column is coupled to a bit line. Each cell in the memory array 38 typically includes a storage capacitor and an access transistor.

The SDRAM 30 interfaces with, for example, a processor 12, such as a microprocessor, through address lines 34 and data lines 32. Alternatively, the SDRAM 30 may interface with other devices, such as a SDRAM controller, a microcontroller, a chip set, or other electronic system. The microprocessor 12 also may provide a number of control signals to the SDRAM 30. Such signals may include row and column address strobe signals RAS and CAS, a write enable signal WE, a clock enable signal CKE, and other conventional control signals. The control logic 36 controls the many available functions of the SDRAM 30. In addition, various other control circuits and signals not detailed herein contribute to the operation of the SDRAM 30, as can be appreciated by those of ordinary skill in the art.

A row address buffer 40 and a row decoder 42 receive and decode row addresses from row address signals provided on the address lines 34. Each unique row address corresponds to a row of cells in the memory array 38. The row decoder 42 typically includes a word line driver, an address decoder tree, and circuitry which translates a given row address received from row address buffers 40 and selectively activates the appropriate word line of the memory array 38 via the word line drivers.

A column address buffer 44 and a column decoder 46 receive and decode column address signals provided on the address lines 34. The column decoder 46 may also determine when a column is defective, as well as the address of a replacement column. The column decoder 46 is coupled to sense amplifiers 48. The sense amplifiers 48 are coupled to complementary pairs of bit lines of the memory array 38.

The sense amplifiers 48 are coupled to data-in (i.e., write) circuitry 50 and data-out (i.e., read) circuitry 52. The data-in circuitry 50 and the data-out circuitry 52 include data drivers and latches, as will be discussed in detail below. During a write operation, the data bus 32 provides data to the data-in circuitry 50. The sense amplifier 48 receives data from the data-in circuitry 50 and stores the data in the memory array 38 as a charge on a capacitor of a cell at an address specified on the address line 34. In one embodiment, the data bus 32 is an 8-bit data bus carrying data at 400 MHz or higher.

During a read operation, the SDRAM 30 transfers data to the microprocessor 12 from the memory array 38. Complementary bit lines for the accessed cell are equilibrated during a precharge operation to a reference voltage provided by an equilibration circuit and a reference voltage supply. The charge stored in the accessed cell is then shared with the associated bit lines. The sense amplifier 48 detects and amplifies a difference in voltage between the complementary bit lines. Address information received on address lines 34 selects a subset of the bit lines and couples them to complementary pairs of input/output (I/O) wires or lines. The I/O wires pass the amplified voltage signals to the data-out circuitry 52 and eventually out to the data bus 32.

The data-out circuitry 52 may include a data driver (not shown) to drive data out onto the data bus 32 in response a read request directed to the memory array 38. Further, the data-out circuitry 52 may include a data latch (not shown) to latch the read data until it is driven on the data bus 32 by the data driver. The timing source for the data latch may be provided by a synchronization device 54 which provides a shifted clock signal which is synchronous with the external system clock signal (XCLK), thus locking the output data signal (DATA) on the data bus 32 to the system clock.

As previously described, various types of synchronization devices 54 may be implemented in the SDRAM 30. As will be appreciated, each of the topologies of the various exemplary synchronization devices 54 (e.g., DLL, SMD, MCD) includes one or more delay lines, a control circuit for the delay line(s) and a delay model. The accuracy of the synchronization device 54 is directly affected by the accuracy of the delay model. As will be described further below, improvements in conventional synchronization devices 54 may be achieved by adding tuning elements to one or more delay paths in the synchronization devices 54 to provide an offset for I/O mismatches created due to inaccuracies in the delay model. To illustrate the problem and solution, an exemplary DLL circuit and associated timing characteristics are illustrated and described in detail with respect to FIGS. 3 and 4. The DLL circuit is described in detail and by way of example to provide an understanding of synchronization devices in general and to better illustrate the improvements thereto provided by embodiments of the present invention. As will be appreciated, the same improvements can be made to other exemplary synchronization devices 54, such as SMD and MCD circuits. A DLL circuit in accordance with one embodiment of the present invention is illustrated and described with reference to FIGS. 5, 6A and 6B. An SMD circuit in accordance with another embodiment of the present invention is illustrated and described with reference to FIGS. 8, 9A and 9B. An MCD circuit in accordance with yet another embodiment of the present invention is illustrated and described with reference to FIGS. 10, 11A and 11B.

Figure 3:
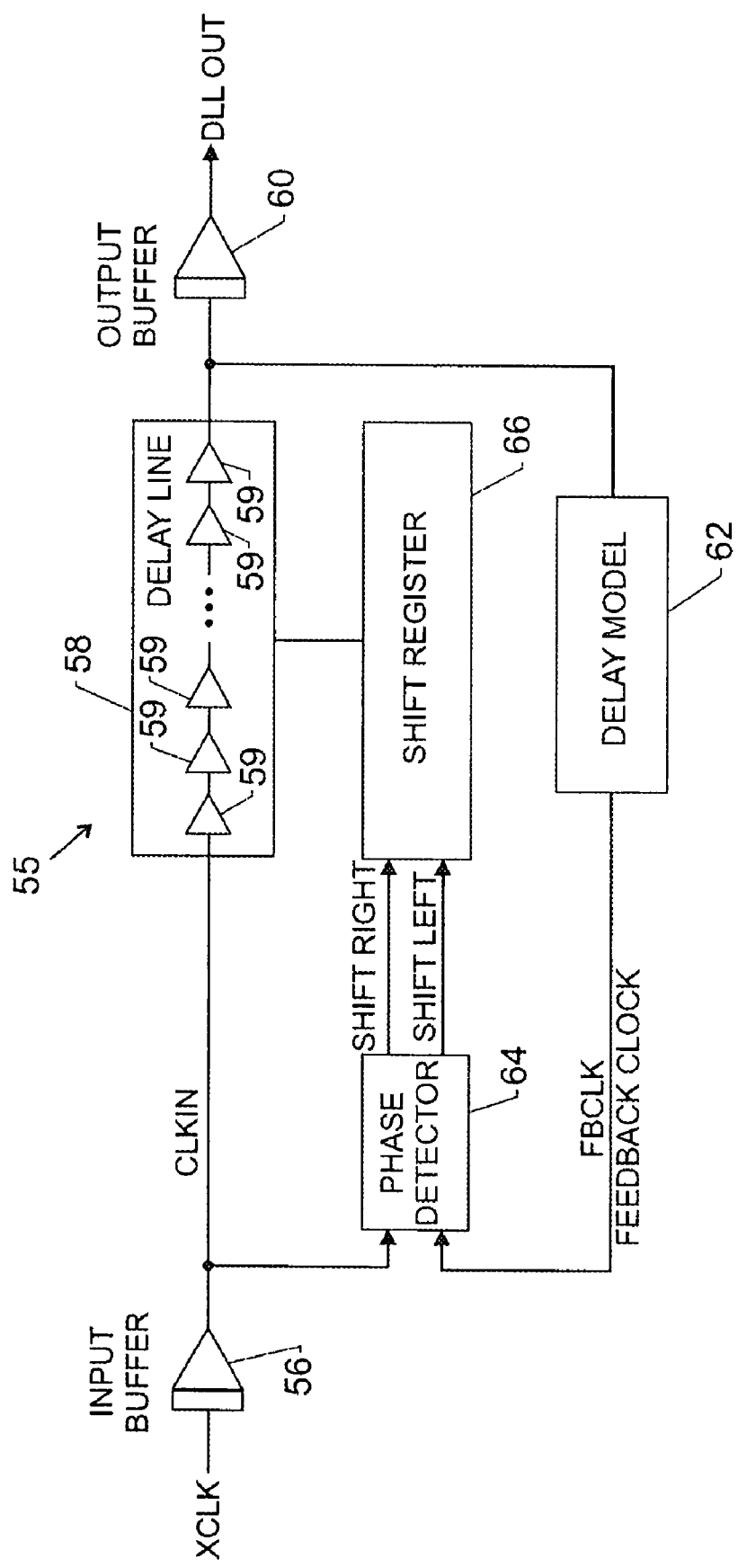
FIG. 3 illustrates a block diagram of a conventional delay locked loop (DLL) used to synchronize the output data from the memory device of FIG. 2 with the system clock.

As discussed above, one type of synchronization device 54 that may be implemented in an SDRAM 30 is a DLL circuit. Turning now to FIG. 3, a conventional DLL circuit 55 is illustrated. Differences in alignment between signals having the same frequency may arise due to propagation delays inherent in each of the various components in the SDRAM 30 through which the signal of interest passes, as well as propagation delays caused by varying lengths of signal buses in the SDRAM 30. As previously described, it may be desirable to drive various components in the system, such as the SDRAM 30, with a reference clock signal generated by an external source and to obtain an output signal from the SDRAM 30 which is synchronous with the reference clock signal. To reach the various components, the reference clock signal may be transmitted through various buffers and buses of various lengths. Thus, when received at the input pin of a particular component, such as the SDRAM 30, the clock signal may no longer be aligned (i.e., is out of phase) with the reference clock signal.

A conventional DLL, such as the DLL circuit 55, implements synchronization by using a shift register to control the entry point of a delay line to force at least one of the edges of the clock signal for the data-out circuit 52 (FIG. 2) to align with a corresponding edge of the reference clock signal XCLK, thus locking the data output signal (DATA) to the reference clock signal. The DLL circuit 55 detects a phase difference between two signals and generates a corresponding feedback signal representative of the difference which is used to introduce or remove delay elements as needed to attain alignment of the data output signal (DATA) with the reference clock signal (XCLK).

In the DLL circuit 55 illustrated in FIG. 3, a reference clock signal XCLK is received by an input buffer 56 and provided to a delay line 58 as a buffered clock signal CLKIN. The delay line 58 includes a number of delay elements 59, such as inverters. By providing a number of delay elements 59, the entry point of the buffered clock signal CLKIN may be adjusted to provide a lock through a range of frequencies, temperatures, input voltages, etc. The output of the delay line 58 is connected to an output buffer 60 and a delay model circuit 62. The delay model circuit 62 provides a feedback clock signal (FBCLK) which is transmitted to a phase detector 64 for comparison with the buffered reference clock signal CLKIN. The phase detector 64 determines whether a difference exists between the phase of the feedback clock signal FBCLK and the buffered reference clock signal CLKIN. The detected difference determines the amount of delay to be introduced in or removed from the delay line 58 by a delay line control, such as shift register 66, such that the buffered reference clock signal CLKIN may be shifted by an appropriate amount to produce an output clock signal DLLOUT that aligns, or locks, with the reference clock signal XCLK. While the present embodiment illustrates a shift register 66, any other suitable means of controlling the timing of the delay line 58, such as a state machine, a look-up table, a counter, charge pump, etc. may be used.

When the DLL circuit 55 has locked the data output signal DLLOUT to the reference clock signal XCLK, then essentially no difference should exist between the phases of the buffered clock signal CLKIN and the clock feedback signal FBCLK. The degree of acceptable phase difference will depend on the application and the precision of the DLL (i.e., the number and size of the delay elements 59 included in the delay line 58). Thus, a DLL is locked when the total delay in the forward path is equal to the total delay in the feedback path. Expressed another way:

$$d_{forward} = t_{input\ buffer} + t_{delay\ line} + t_{output\ buffer}$$

$$d_{feedback} = t_{delay\ line} + t_{feedback}$$

$$d_{forward} = d_{feedback}$$

where $d_{forward}$ corresponds to the delay between the reference clock signal XCLK and the data output signal DLLOUT; $d_{feedback}$ corresponds to the delay in the feedback delay circuit; $t_{inputbuffer}$ corresponds to the delay of the input buffer 56;

$t_{delay\ line}$ corresponds to the delay in the delay line 58; $t_{output\ buffer}$ corresponds to the delay of the output buffer 60; and $t_{feedback}$ corresponds to the delay in the delay model circuit 62. Thus, to achieve phase lock, $$t_{feedback} = t_{input\ buffer} + t_{output\ buffer}$$

Thus, the delay model circuit 62 introduces delays in the feedback path corresponding to the delay ($t_{input\ buffer}$) introduced by the input buffer 56 and the delay ($t_{output\ buffer}$) introduced by the output buffer 60. Because $t_{feedback}$ is a constant, when the input changes frequency, the $t_{delay\ line}$ should change in response to the changing input. The phase detector 64 provides the shift register 66 with a shift left or shift right signal depending on whether the buffered clock signal CLKIN is too fast or too slow. The shift register 66 then shifts the entry point of the delay line 58 by one delay element. The process is repeated until the input signals to the phase detector 64 are phase equal and the DLL circuit 55 is locked.

Figure 4:
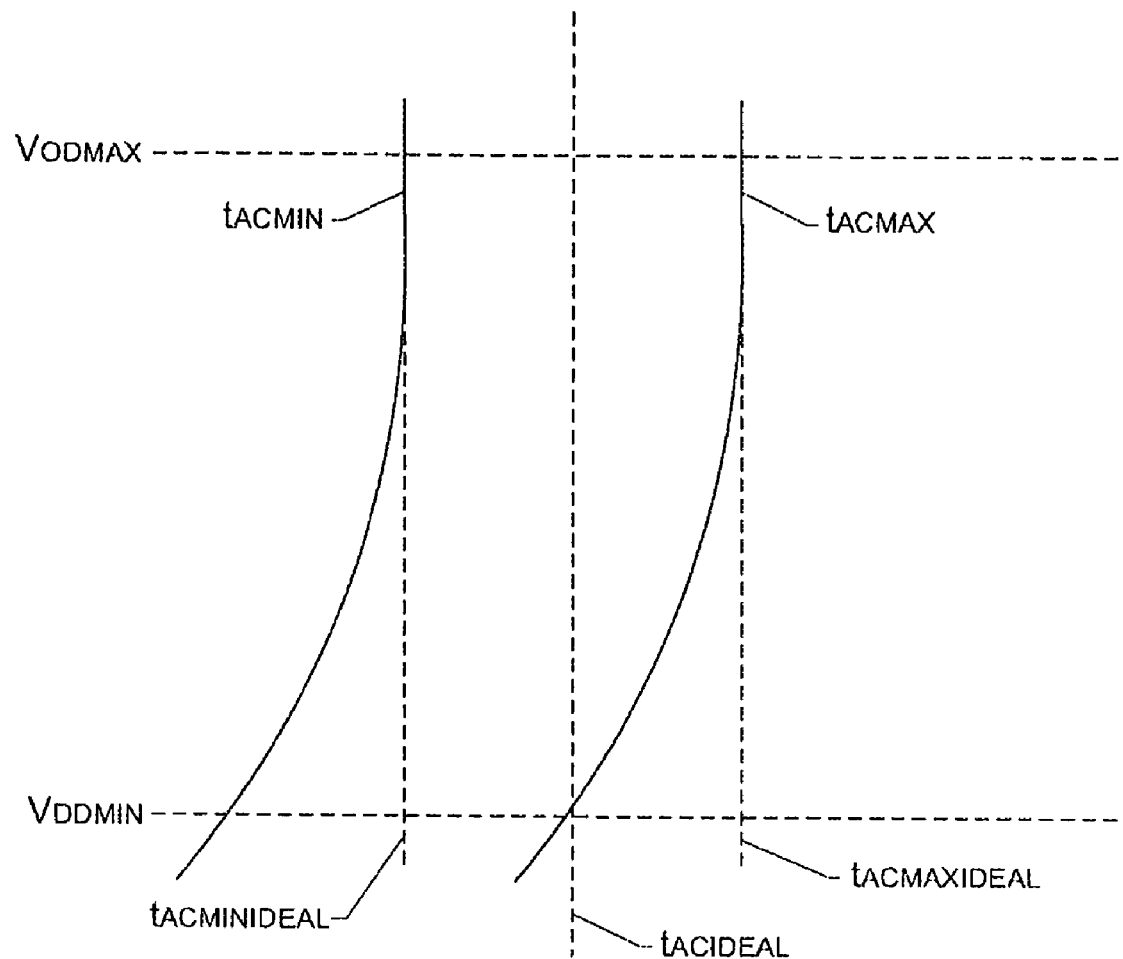
FIG. 4 illustrates an exemplary shmoo plot illustrating drain voltage ($V_{DD}$) versus access time ($t_{AC}$)

As previously described, ideally, the data access time $t_{AC}$ is equal to zero over all voltages and temperatures. However, in practice, there is generally some time period in which data may be invalid. For discussion purposes, this concept is generally illustrated with reference to FIG. 4. FIG. 4 generally illustrates a "shmoo" which is a measurement over time that may be used to evaluate the validity of the data access time $t_{AC}$ with reference to some characteristic, such as a device voltage (e.g., drain voltage $V_{DD}$), temperature or clock period $t_{CK}$, for example. More specifically, FIG. 4 illustrates a shmoo of the minimum valid access time ($t_{ACMIN}$) and the maximum valid access time ($t_{ACMIN}$) through a range of drain voltages, indicated here as $V_{DDMIN}$ and $V_{DDMAX}$. Data is generally invalid between $t_{ACMIN}$ and $t_{ACMAX}$. The $t_{ACMIN}$ curve represents the time at which the first data bit went invalid for the data eye before the clock. The $t_{ACMAX}$ curve represents the time at which the last data bit went valid for the data eye after the clock. The time region before the $t_{ACMIN}$ curve is good data before the clock and the time region after the $t_{ACMAX}$ curve is good data after the clock. The area between $t_{ACMIN}$ and $t_{ACMAX}$ where data is invalid is generally referred to as "jitter."

Ideally, the data is always valid and the jitter region would have a width of zero. That is to say that $t_{ACMIN}$ and $t_{ACMAX}$ would simply be replaced by $t_{ACIDEAL}$ and there would be no time in which data is invalid. However, as can be appreciated, there is generally some period over which data is not valid. Not only is it desirable to minimize the jitter period, but to ensure predictability and consistency over various voltages and temperatures, for example, it is also advantageous to minimize the variation of $t_{ACMIN}$ and $t_{ACMAX}$ over voltage/temperature. That is to say that it is desirable to design a DLL circuit 55 such that $t_{ACMIN}$ and $t_{ACMAX}$ are constant over time, illustrated in FIG. 4 as $t_{ACMINIDEAL}$ and $t_{ACMAXIDEAL}$. As can be appreciated, $t_{ACMINIDEAL}$ and $t_{ACMAXIDEAL}$ are illustrated under the expectation of some system jitter. If the system has a non-ideal jitter, but the model assumes an ideal jitter condition, then $t_{ACMINIDEAL}$ and $t_{ACMAXIDEAL}$ represent the expected ideal curves. In other words, $t_{ACMINIDEAL}$ and $t_{ACMAXIDEAL}$ assume ideal delay modeling, but non-ideal jitter.

In the exemplary shmoo illustrated in FIG. 4, $t_{ACMIN}$ and $t_{ACMAX}$ bend to the left of their respective ideal values. As previously described, the DLL circuit 55 is only as good as the references provided to the phase detector 64, and there is an underlying assumption that the feedback path perfectly models the real path across all variations of voltage, temperature and clock period (i.e., that the delay model 62 is perfect). However, in the example illustrated with reference to FIG. 4, the delay model 62 is getting more delay than the real forward path at low voltages. As can be appreciated, if the delay model 62 has more delay, then the DLL circuit 55 adjusts and removes delay from the variable delay line 58, causing the total forward path delay in the system to be reduced. This means that the data will be clocked out earlier, showing up as a bend to the left in the shmoo, as illustrated in FIG. 4.

As previously described, the variability of the access time over voltage, temperature or clock cycle is generally undesirable. As can be appreciated, while the shmoo curves illustrated in FIG. 4 are illustrated with reference to drain voltage $V_{DD}$, similar curves could be plotted over temperature or clock period ($t_{CK}$), for example. Further, while the exemplary plots illustrated in FIG. 4 indicate a curve to the left at low voltages, for each of $t_{ACMIN}$ and $t_{ACMAX}$, it should be clear that other types of I/O mismatch may occur. That is to say that one or both of the curves could bend to the right or left at the upper or lower end of the range (here voltage), depending on whether the delay model 62 tracks too weakly or strongly. The bend in the shmoo plots (e.g., left or right) is directly related to the accuracy of the delay model 62.

Figure 5:
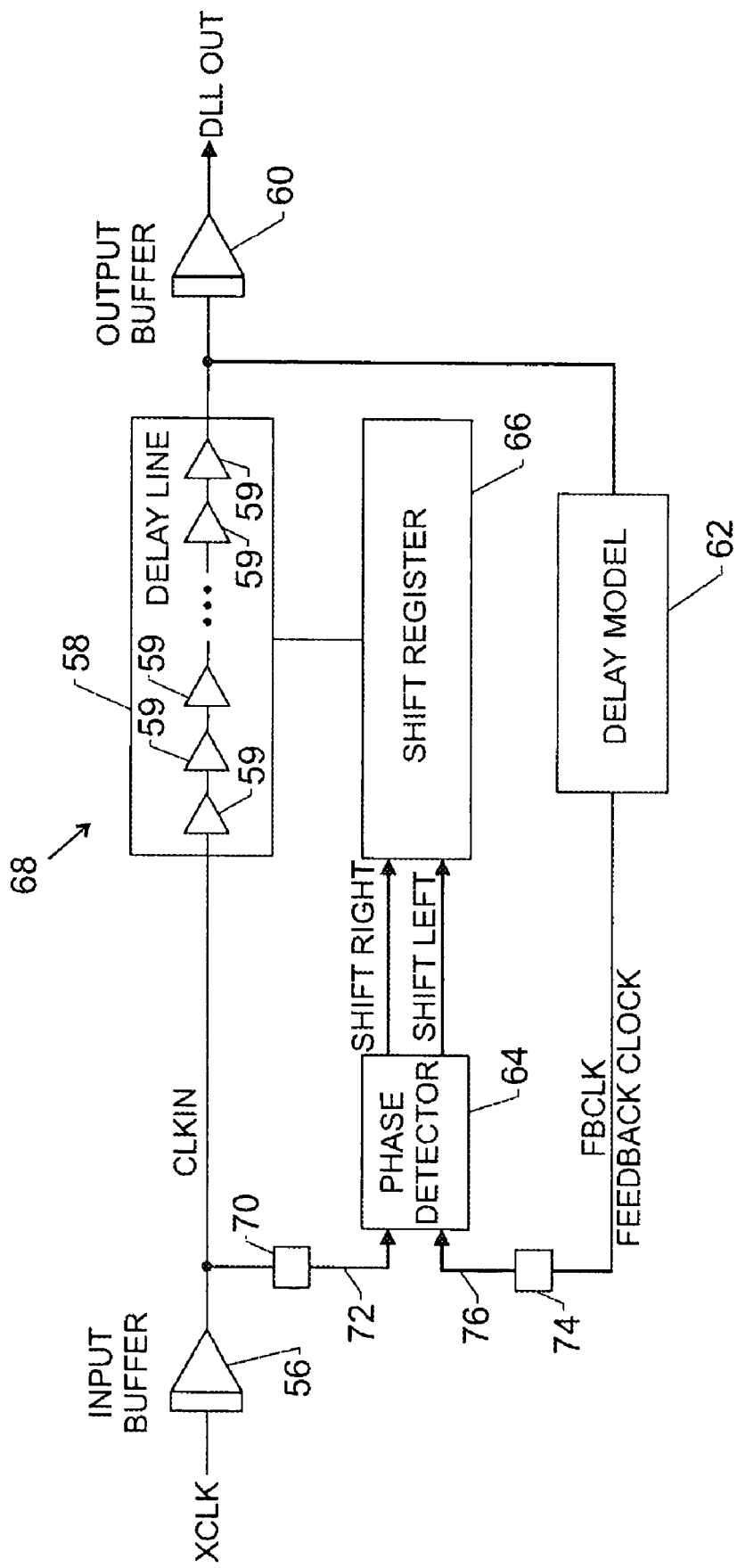
FIG. 5 illustrates a block diagram of an exemplary delay locked loop (DLL) in accordance with embodiments of the present inventions.

Referring now to FIG. 5, a modified DLL circuit 68, having tuning elements 70 in a first path, here the reference path 72, and tuning elements 74 in a second path, here the feedback path 76, is illustrated. The tuning elements 70 and 74 may be implemented to tune out or compensate for the I/O mismatch, illustrated in FIG. 4, over temperature, voltage and/or clock period. By providing tuning elements 70 and 74 in each of the reference path 72 and the feedback path 76, I/O model tuning may be advantageously performed in both directions with a single tuning element design. Specifically, the tuning element 70 in the reference path 72 may be implemented to tune $t_{AC}$ versus $V_{DD}$ in one direction while the use of the same-style tuning element 74 in the feedback path 76 may be implemented to tune the $t_{AC}$ behavior in the opposite direction (i.e., the tuning element 70 may be implemented if the shmoo curves to the left, while the tuning element 74 may be implemented if the shmoo curves to the right). Using either tuning element 70 or 74, or a combination of both tuning elements 70 and 74 allows $t_{AC}$ to operate properly across $V_{DD}$, even when the delay model 62 does not properly track.

As can be appreciated by those skilled in the art, the particular type of delay elements that are implemented in each of the tuning elements 70 and 74 may be selected depending on the desired effect on the access time $t_{AC}$. For instance, gate delay elements such as inverters, which are typically $V_{DD}$ sensitive may be implemented in the tuning elements 70 and 74. Alternatively, wire delays, RC delays or gate delay circuits implementing bias generators, for example, which are typically less $V_{DD}$ sensitive may be used to form the tuning elements 70 and 74. For example, if the $t_{AC}$ shmoo bends to the left at low voltages (as illustrated in FIG. 4), the feedback path delay model 62 is too sensitive to $V_{DD}$ variation. To compensate or tune the output, a tuning element 74 that is less sensitive to $V_{DD}$ variation (e.g., wire delay, RC-delay, or delay circuits that uses bias controls, wherein the bias generators can be designed to react in varying fashions with respect to $V_{DD}$ and temperature) is implemented in the feedback path 76. Advantageously, with this tuning topology, if the shmoo bends to the right at low voltages, the same style of delays could still be implemented to compensate, by implementing the tuning element 70 in the reference path 72. Thus, the particular type of devices used in the tuning elements 70 and 74 may be identical and may be designed for simplicity and/or to produce a desired characteristic, such as low power requirements. Because the tuning elements 70 and 74 are located in each of the reference path 72 and the feedback path 76, the DLL circuit 68 may be tuned to produce a number of desirable results.

Figure 6A:
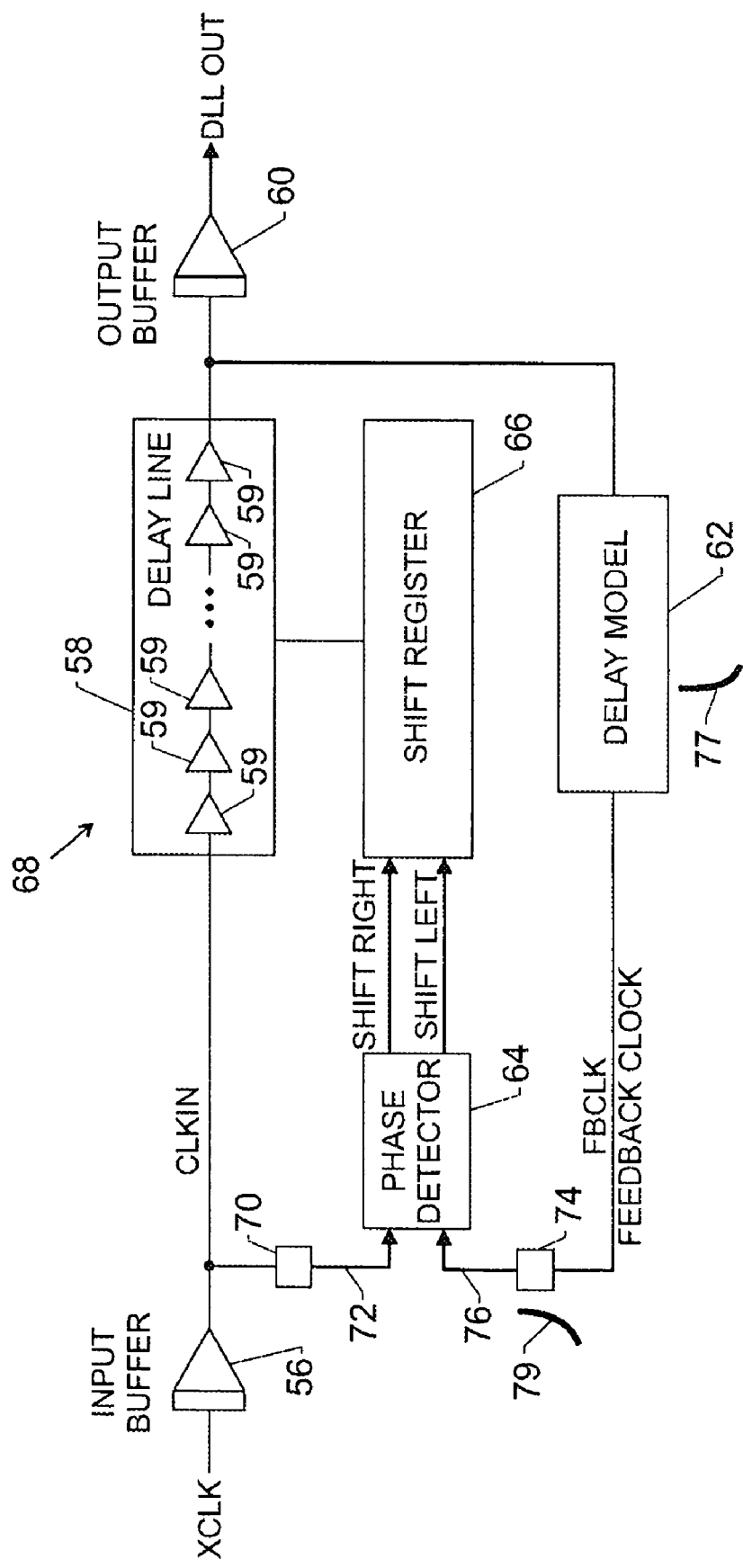
FIGS. 6A and 6B illustrates exemplary tuning techniques for a delay locked loop (DLL) in accordance with embodiments of the present inventions.
Figure 6B:
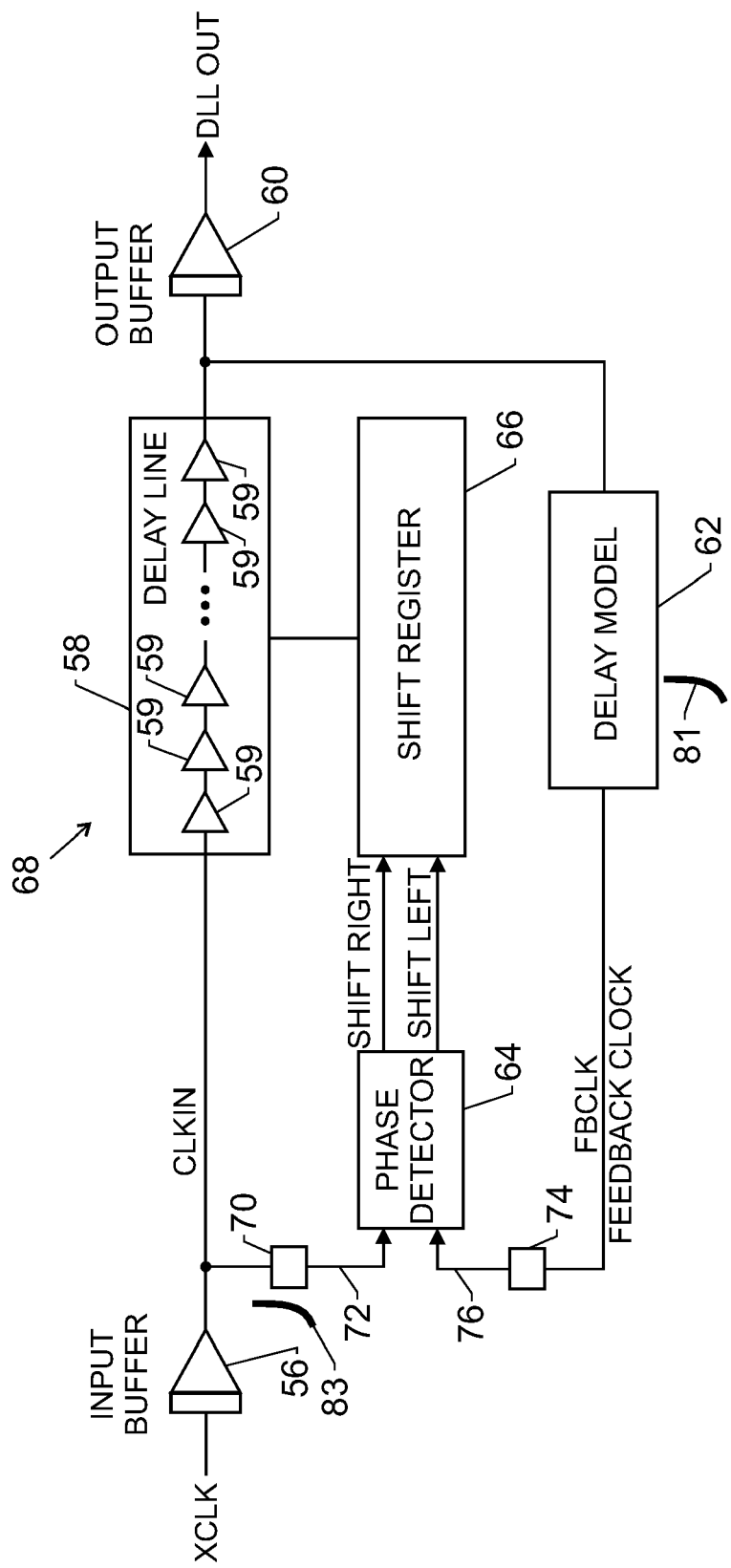

FIGS. 6A and 6B illustrate two exemplary I/O mismatch scenarios to demonstrate the implementation of the present techniques, wherein the same design for the DLL circuit 68 may be tuned regardless of the specific mismatch, by selecting the appropriate tuning element 70 or 74. Advantageously, a single design for the tuning elements 70 and 74 may be implemented. FIG. 6A illustrates a delay model 62 that produces a shmoo 77 that curves to the right at low $V_{DD}$. To compensate, the delay element 74 in the feedback path 76 is designed to have a response opposite to that of the delay model 62 (i.e., curves to the left at low $V_{DD}$, as illustrated by the curve 79). FIG. 6B illustrates a delay model 62 that produces a shmoo 81 that curves to the left at low $V_{DD}$. In this case, the I/O mismatch may be tuned out using the delay element 70 in the reference path 72. As with the delay element 74, the delay element 70 produces a curve 83 to the left. Because the phase detector 64 receives the same mismatch in both the reference path 72 and the feedback path 76, the forward-path delay ($t_{AC}$) remains constant across $V_{DD}$. As can be appreciated, if the tuned delay does not exactly match the mismatch in the delay model 62, a combination of weighted delays, in both the reference path 72 and the feedback path 76 may be implemented.

Figure 7:
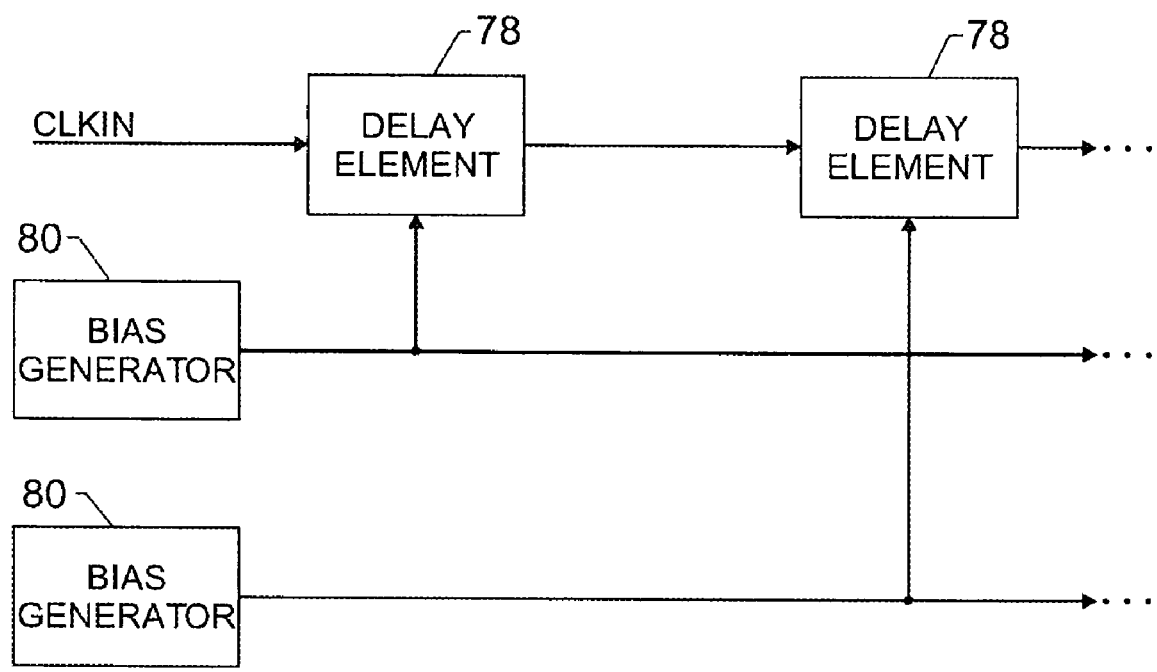
FIG. 7 illustrates a block diagram of an exemplary tuning element in accordance with embodiments of the present invention.

In one exemplary embodiment of the synchronization device 54, such as the DLL circuit 68, the tuning elements 70 and 74 may include a number of individual delay elements 78 that are controlled by one or more bias generators 80, as indicated in FIG. 7. As previously described, the type of delay elements 78 may vary, depending on the particular design of the synchronization device 54. In one exemplary embodiment, the delay elements 78 may comprise differential delay elements. Advantageously, differential delay elements exhibit a favorable duty cycle response and require only one bias generator 80, resulting in better power supply rejection. In another exemplary embodiment, the delay elements 78 may comprise single-ended, current-starved elements. While this type of delay element 78 may require two matched bias generators 80 and may be more susceptible to power supply noise, it may be desirable depending on the requirements of the delay model 62.

The bias generators 80 may be designed to respond as a desired function of $V_{DD}$ and/or temperature. The response to the variable of interest, such as $V_{DD}$ or temperature, will determine the delay response of the delay model 62. The number and type of bias generators 80 may vary. For example, the bias generators 80 may be strong functions of $V_{DD}$ and/or temperature, such as MOSFET voltage dividers, resistor dividers, etc. Alternatively, the bias generators 80 may be moderate functions of $V_{DD}$ and/or temperature, such as threshold reference self-biased circuits, diode referenced self-biased circuits, thermal voltage referenced self-biased circuits, etc. Still further, the bias generators 80 may be weak functions of $V_{DD}$ and/or temperature, such as bandgap devices, beta multipliers, etc. As can be appreciated, the selected combination of the bias generators 80 produces the proper tuning of the delay model 62.

Figure 8:
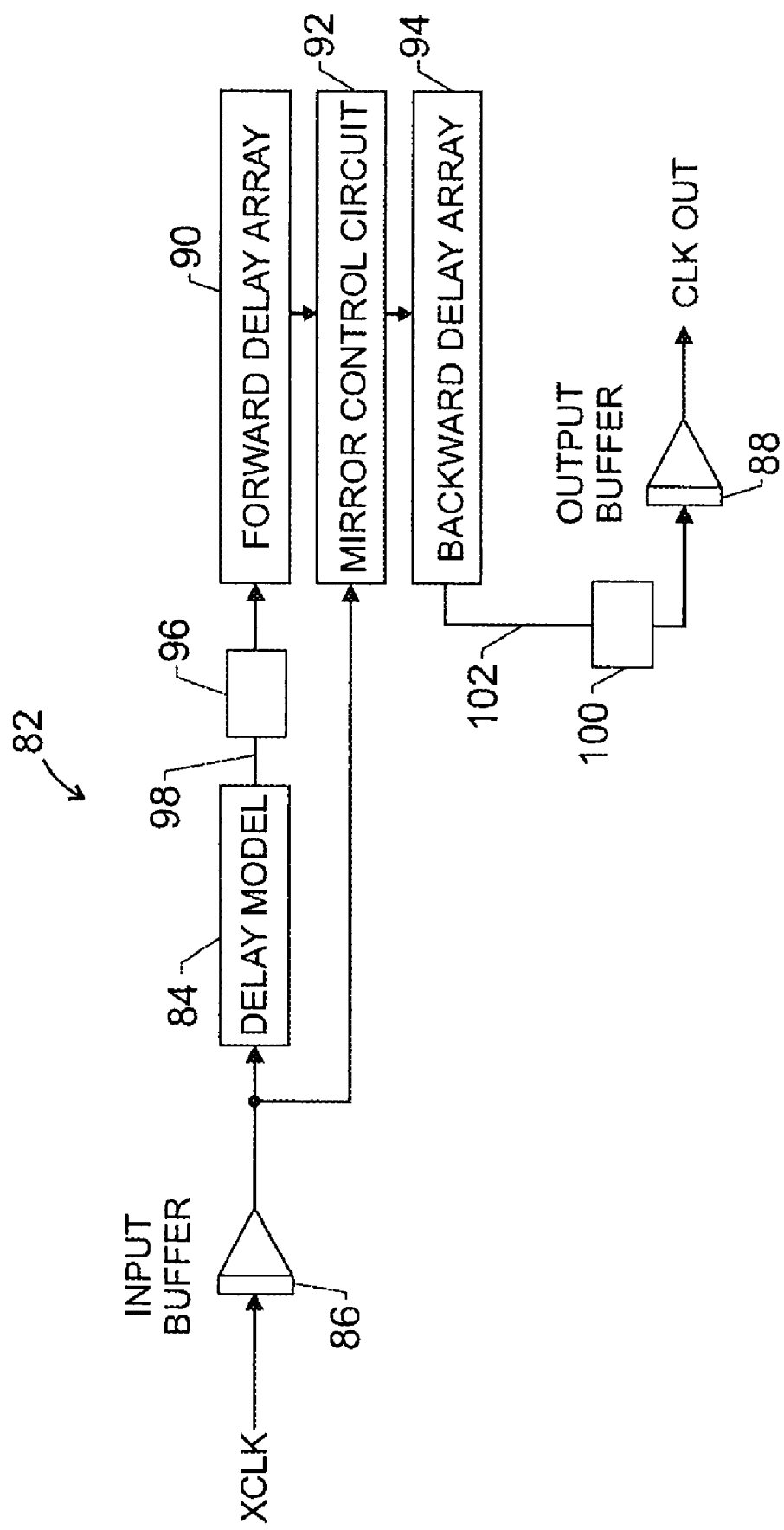
FIG. 8 illustrates a block diagram of an exemplary synchronous mirror delay (SMD) in accordance with embodiments of the present inventions.

As previously described, similar techniques may be implemented by adding tuning elements at various points in the forward (i.e., reference) path of a synchronous mirror delay (SMD) circuit 82, as illustrated in FIG. 8. The SMD circuit 82 includes a delay model 84. The delay model 84 is configured to model the delays through the input buffer 86 and the output buffer 88. The SMD circuit 82 further includes a Forward Delay Array (FDA) 90. The FDA 90 comprises a delay line having an output tap at every stage of the delay line. The output tap configuration of the FDA 90 allows a controller, here the Measure Control Circuit (MCC) 92, to cause the clock edge to drop down into a second delay line, here the Backward Delay Array (BDA) 94. The BDA 94 generally comprises a delay line with an input tap at every stage.

During operation, the external clock signal XCLK propagates as far into the FDA 90 as it can before the NEXT clock (the N+1th clock) triggers the MCC 92. The MCC 92 causes the clock edge to move down into the BDA 94, after which the synchronized output clock signal CLKOUT propagates out of the BDA 94. To provide better matching in accordance with embodiments of the present techniques, a first tuning element 96 is added to a first signal path 98, and a second tuning element 100 is added to a second signal path 102. As with the tuning elements 70 and 74 of the DLL circuit 68 (FIG. 5), the tuning elements 96 and 100 are identically designed such that the same delay design may be implemented to properly tune the SMD circuit 82 in either direction, as described further below with respect to FIGS. 9A and 9B.

Figure 9A:
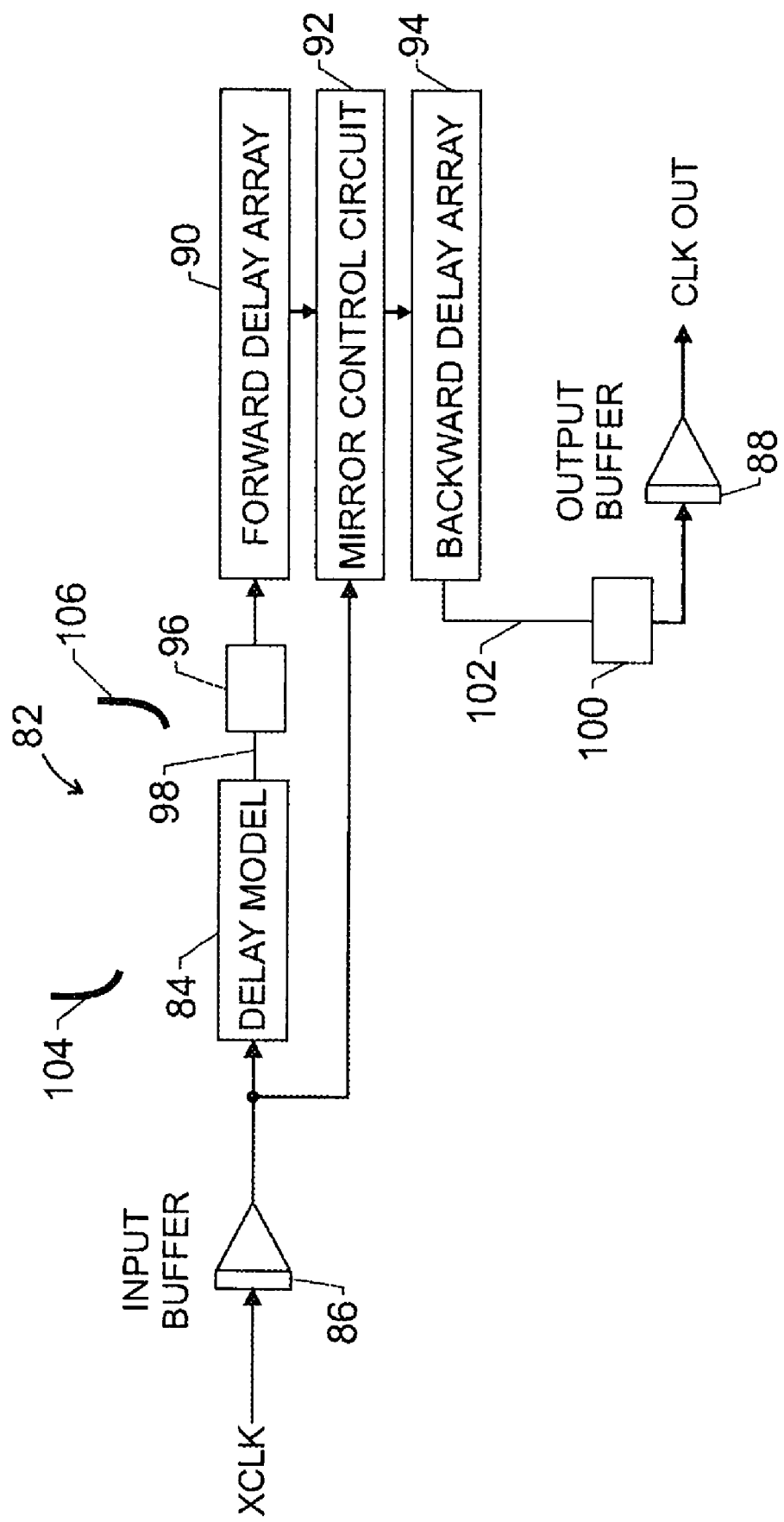
FIGS. 9A and 9B illustrates exemplary tuning techniques for a synchronous mirror delay (SMD) in accordance with embodiments of the present inventions.
Figure 9B:
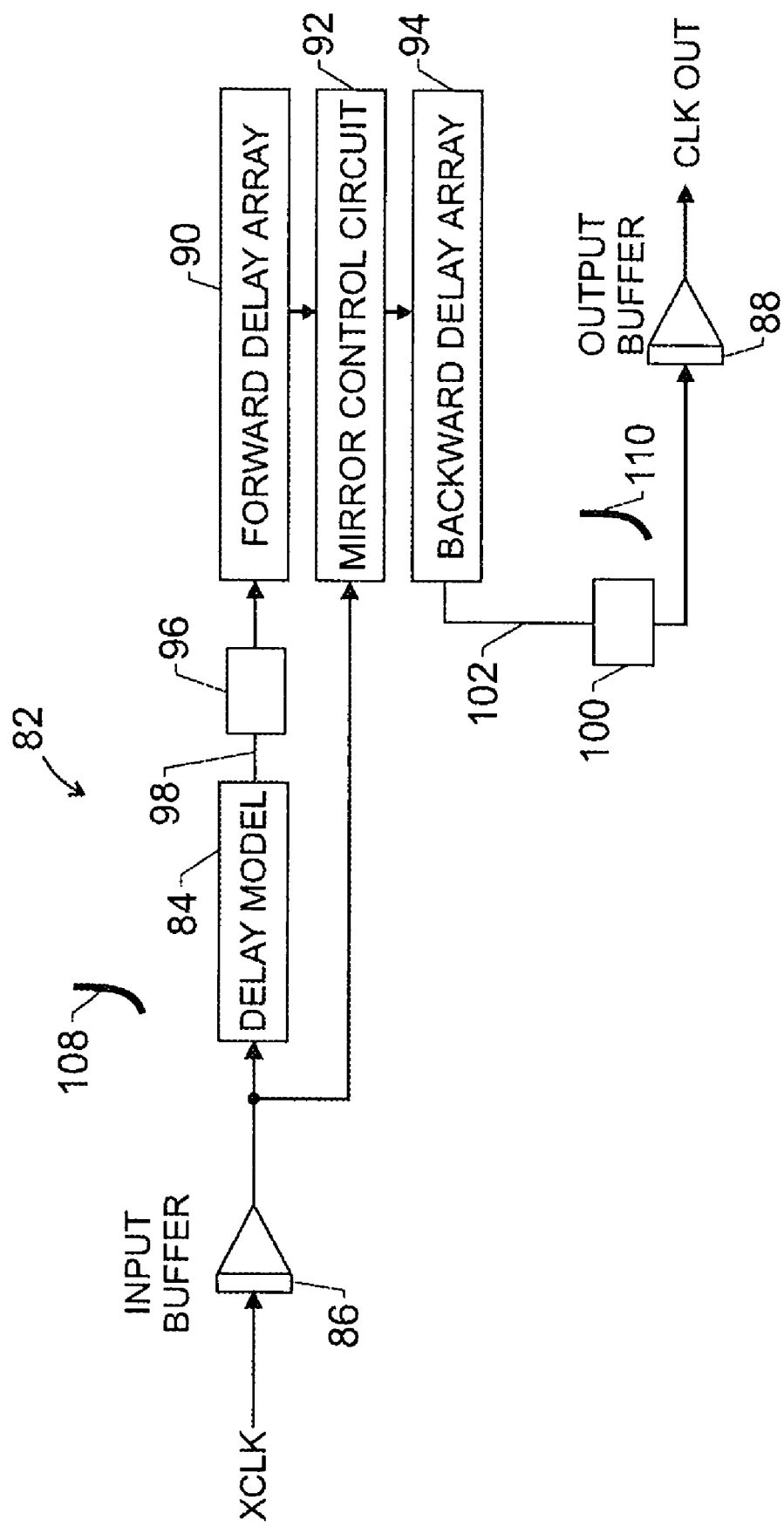

As can be appreciated, the forward-path delay through the SMD circuit 82 includes a negative delay term through the tuning element 96 and a positive delay term through the tuning element 100. If both of the delay elements 96 and 100 are designed to be identical, the same delay design may be used to perform the proper tuning of a delay model 84 mismatch in either direction. FIG. 9A illustrates an implementation for tuning a mismatch of the delay model 84 that curves to the right at low $V_{DD}$, as indicated by the shmoo curve 104. To compensate for the I/O mismatch that curves to the right, the first tuning element 96 may be implemented as indicated by the curve 106 in FIG. 9A. If the mismatch curves to the left, as indicated by the shmoo curve 108 in FIG. 9B, the second tuning element 100 may be implemented to tune the mismatch, as indicated by the curve 110.

Thus, to compensate for a mismatch that curves either left or right, the same design may be implemented for each tuning element 96 and 110 and the appropriate tuning element 96 or 100 may be selected. Because the timing measurement increases as the delay model 84 decreases (or vice-versa), a small delay that bends in the same direction as the delay model 84 (decreases in this example) will compensate the output path. Advantageously, the forward path delay ($t_{AC}$) remains constant across $V_{DD}$ (and/or temperature). As can be appreciated, if the tuned delay does not exactly match the mismatch in the delay model 84, a combination of weighted delays, in both the first path 98 and the second path 102 may be implemented.

Figure 10:
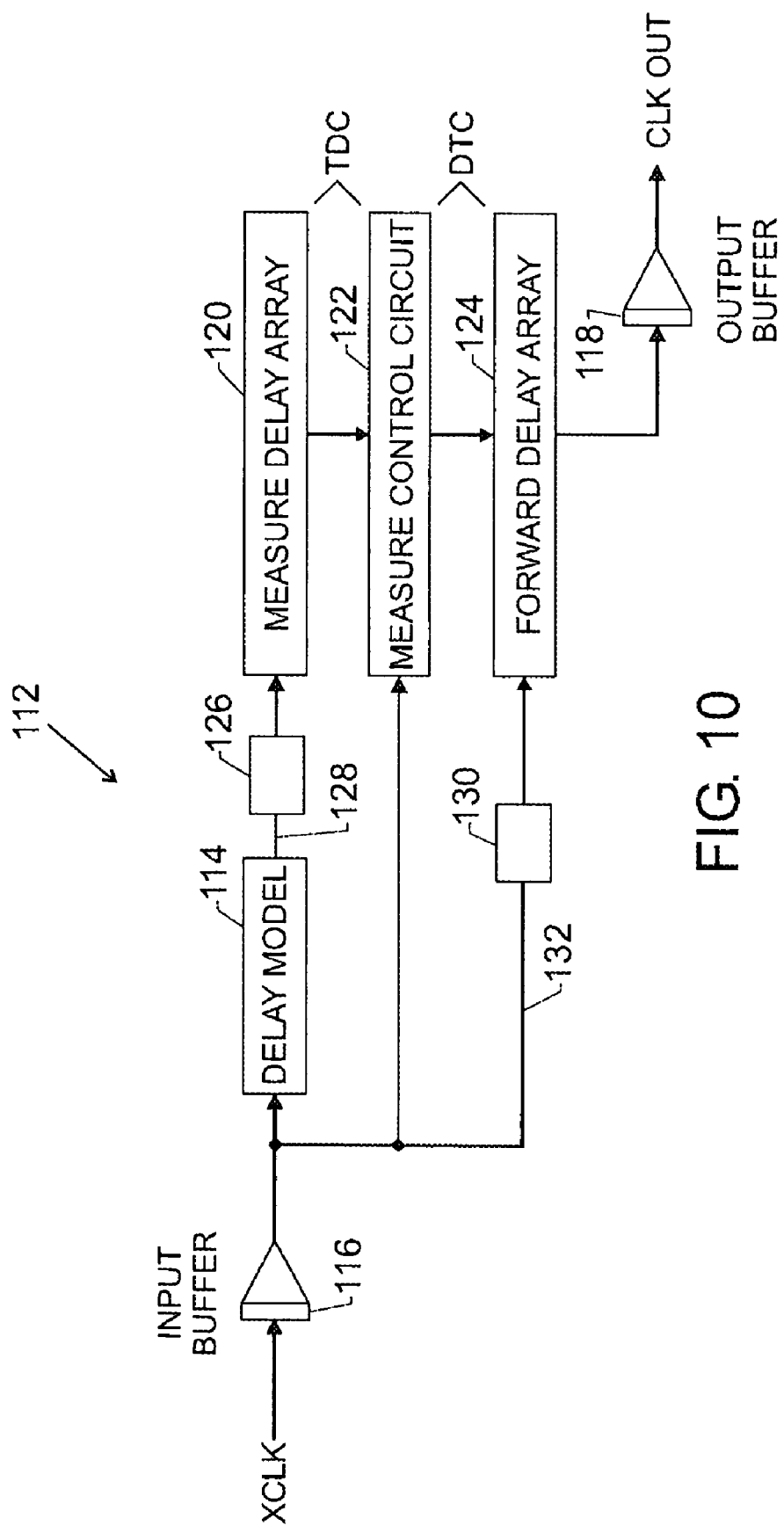
FIG. 10 illustrates a block diagram of an exemplary measure-controlled delay (MCD) in accordance with embodiments of the present inventions.

Similar techniques may be implemented by adding tuning elements to various points of a measure-controlled delay (MCD) circuit 112, as illustrated in FIG. 10. The MCD circuit 112 includes a delay model 114. The delay model 114 is configured to model the delays through the input buffer 116 and the output buffer 118. The MCD circuit 112 further includes a Measure Delay Array (MDA) 120, a measure control circuit (MCC) 122, such as a latch, and a forward delay array (FDA) 124. The MCD circuit 112 is similar to the DLL circuit 68 (FIG. 5) in that the FDA 124 is a register-controlled delay line, and the MDA 120 has an output tap that allows the control circuit, here the measure control circuit 122 to capture the position of the clock edge.

The MCD circuit 112 is similar to the SMD circuit 82 in that the N+1th clock causes a measurement to be performed (time-to-digital conversion, "TDC"). The measurement is loaded into the control circuit, here the measure control circuit 112, for the FDA 124. In certain applications of synchronization devices 54, the MCD circuit 112 may be desirable, because the frequency of measuring the delay may be controlled for various reasons, such as power savings. Further, the MCD circuit 112 allows filtering based on the measurements taken by the measure control circuit 112. Also, because the actual synchronization clock propagates through only one delay line (FDA 124) in the MCD circuit 112, (as opposed to two, as in the SMD circuit 82), the MCD circuit 112 may exhibit less jitter.

To provide better matching in accordance with embodiments of the present techniques, a first tuning element 126 is added to a first signal path 128, and a second tuning element 130 is added to a second signal path 132. As with the tuning elements 70 and 74 of the DLL circuit 68 (FIG. 5), the tuning elements 126 and 130 are identically designed such that the same delay design may be implemented to properly tune the MCD circuit 112 in either direction, as described further below with respect to FIGS. 11A and 11B.

Figure 11A:
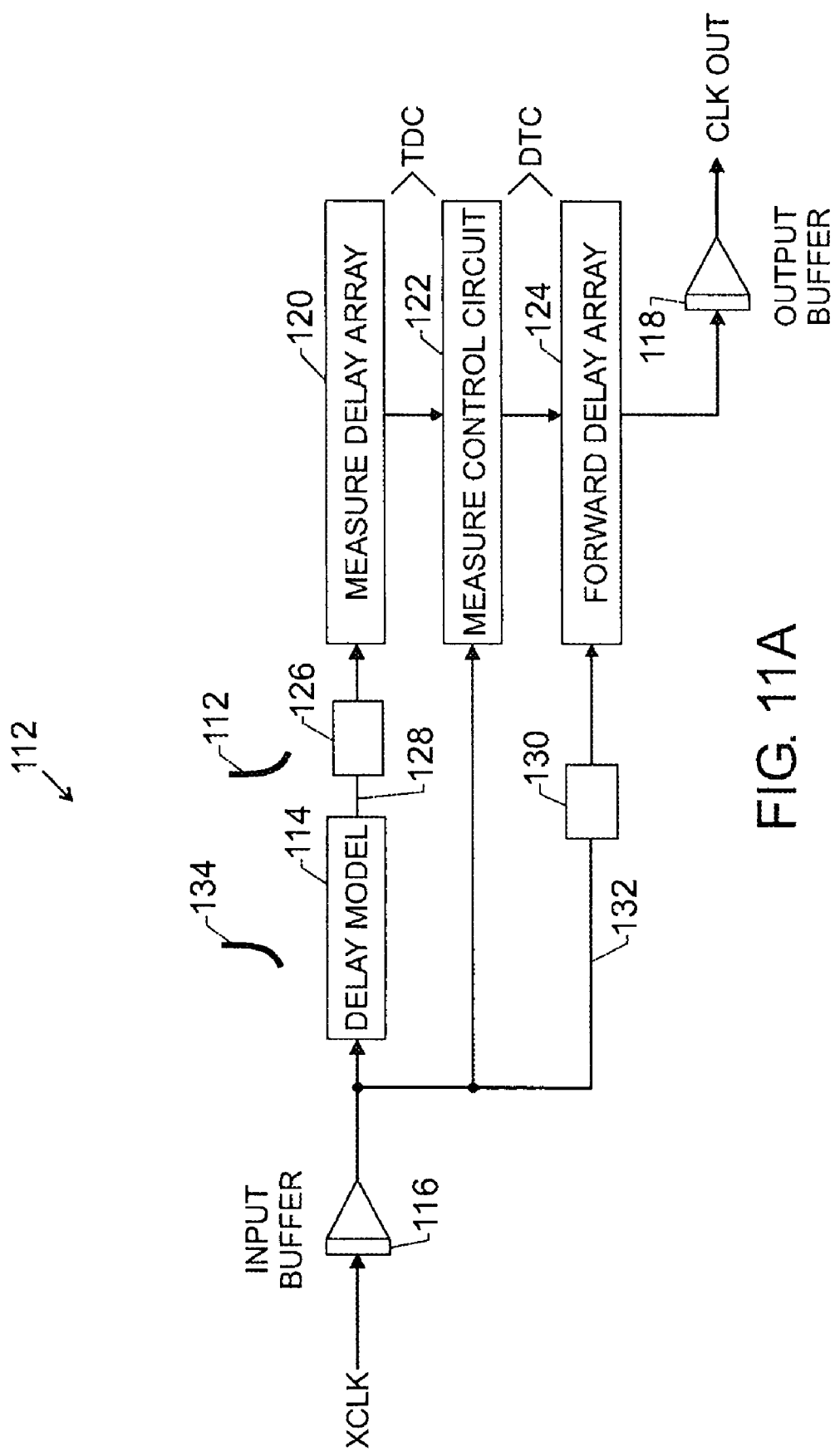
FIGS. 11A and 11B illustrates exemplary tuning techniques for a measure-controlled delay (MCD) in accordance with embodiments of the present inventions.
Figure 11B:
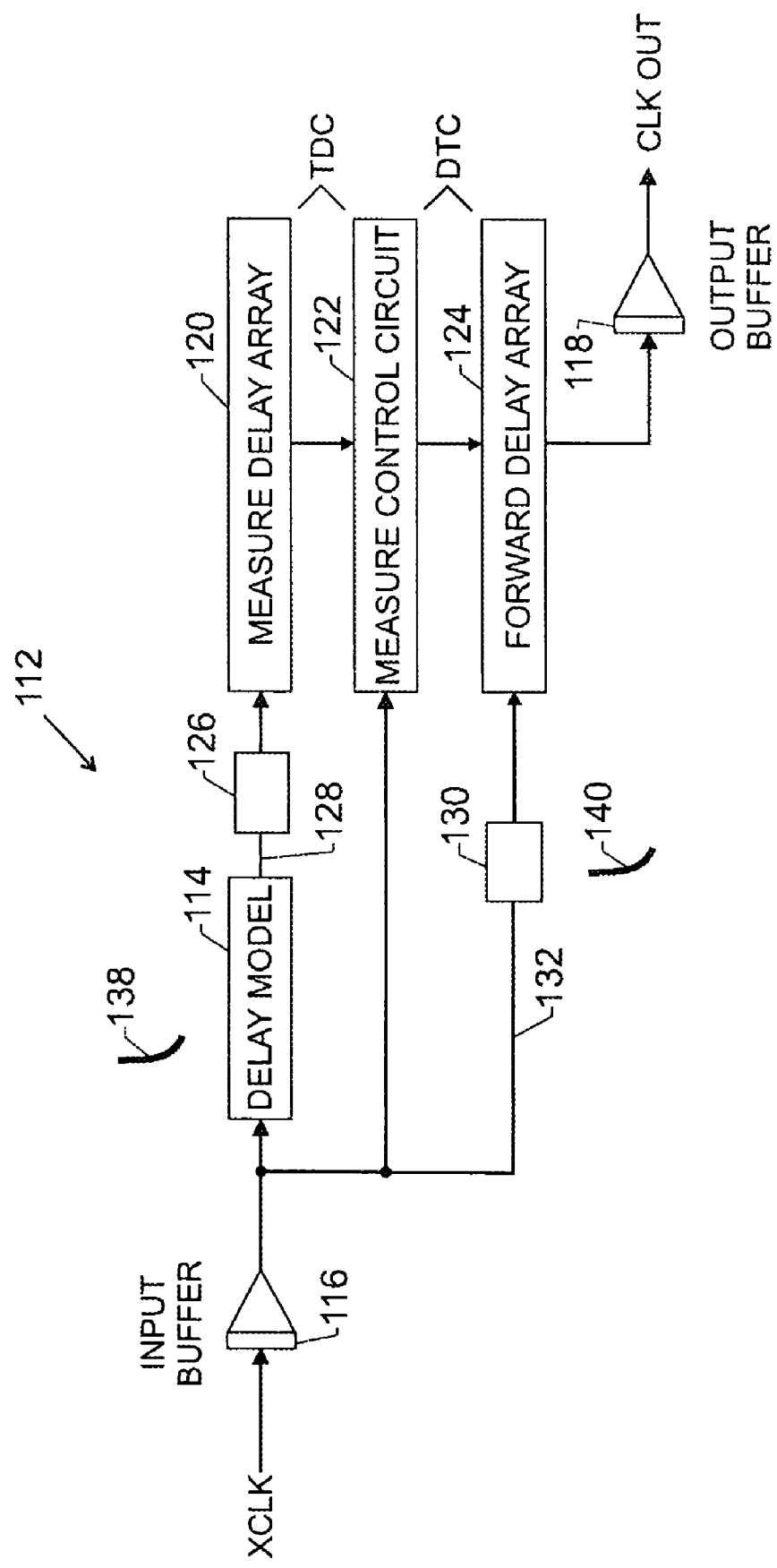

As can be appreciated, the forward-path delay through the MCD circuit 112 includes a negative delay term through the first tuning element 126 and a positive delay term through the second tuning element 130. If both of the delay elements 126 and 130 are designed to be identical, the same delay design may be used to perform the proper tuning of a delay model 114 mismatch in either direction. FIG. 11A illustrates an implementation for tuning a mismatch of the delay model 114 that curves to the left at low VDD, as indicated by the shmoo curve 134. To compensate for the I/O mismatch that curves to the left, the first tuning element 126 may be implemented as indicated by the curve 136 in FIG. 11A. If the mismatch curves to the right, as indicated by the shmoo curve 138 in FIG. 11B, the second tuning element 130 may be implemented to tune the mismatch, as indicated by the curve 140.

Thus, to compensate for a mismatch the curves either left or right, the same design may be implemented for each tuning element 126 and 130 and the appropriate tuning element 126 or 130 may be selected. Because the timing measurement increases as the delay model 114 decreases (or vice-versa), a small delay that bends in the same direction as the delay model 114 (decreases in this example) will compensate the output path. Advantageously, the forward path delay ($t_{AC}$) remains constant across $V_{DD}$ (and/or temperature). As can be appreciated, if the tuned delay does not exactly match the mismatch in the delay model 114, a combination of weighted delays, in both the first path 128 and the second path 132 may be implemented.

While the tuning element pairs described above (i.e., 70 and 74, 96 and 100, 126 and 130) may comprise independent tuning elements, as illustrated in the present figures, in alternate embodiments, a single tuning element may be implemented, wherein a switch is implemented to place the tuning element in the desirable path (i.e., the first path or the second path). The path selection and implementation of the single tuning element would be based on the direction of the mismatch. Advantageously, by using a switch, the single tuning element may be coupled into the desirable path.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A synchronization device comprising:
 a delay model circuit configured to receive a delay model input signal and produce a delay model output signal having a time delay with respect to the delay model input signal, wherein the delay model is configured to model input and output delays in the synchronization device; and
 one or more tuning elements configured to provide an offset for input/output mismatches injected by the delay model circuit wherein the offset is selected from the group consisting of offset over temperature and offset over voltage.

2. The synchronization device, as set forth in claim 1, wherein each of the one or more tuning devices is identical.

3. The synchronization device, wherein the synchronization device comprises one of a delay locked loop (DLL) circuit, a synchronous mirror delay (SMD) circuit or a measure-controlled delay (MCD) circuit.

4. A delay locked loop comprising:
 an input buffer configured to receive an external clock signal and configured to transmit an internal clock signal;
 a delay line configured to receive the internal clock signal;
 a delay model circuit configured to receive the internal clock signal from the delay line and configured to transmit a feedback clock signal;
 a phase detector configured to receive the internal clock signal from the input buffer and the feedback clock signal from the delay model circuit;
 a first tuning element arranged between the input buffer and the phase detector; and
 a second tuning element arranged between the delay model circuit and the phase detector.

5. The delay locked loop, as set forth in claim 4, comprising a shift register coupled between the phase detector and the delay line and configured to shift a signal received from the internal clock signal by an amount of time equivalent to one delay element in the delay line in response to a shift command output received from the phase detector.

6. The delay locked loop, as set forth in claim 4, comprising an output buffer configured to receive the internal clock signal from the delay line.

7. The delay locked loop, as set forth in claim 6, wherein the delay model circuit is configured to model delay through the input buffer and the output buffer, and wherein the first tuning element and the second tuning element are configured to provide an offset for input/output mismatches of the delay model circuit.

8. The delay locked loop, as set forth in claim 4, wherein the first tuning element and the second tuning element are configured to tune a respective signal such that the signal is constant over a range of temperatures or drain voltages, or both.

\* \* \* \* \*